(12) United States Patent
Zhang et al.

(10) Patent No.: US 8,455,303 B2
(45) Date of Patent: *Jun. 4, 2013

(54) SEMICONDUCTOR PACKAGE WITH ADHESIVE MATERIAL PRE-PRINTED ON THE LEAD FRAME AND CHIP, AND ITS MANUFACTURING METHOD

(75) Inventors: Xiaotian Zhang, San Jose, CA (US); Jun Lu, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/545,225

(22) Filed: Jul. 10, 2012

(65) Prior Publication Data

US 2012/0322207 A1    Dec. 20, 2012

Related U.S. Application Data

(63) Continuation of application No. 12/799,811, filed on Apr. 30, 2010, now Pat. No. 8,222,088, which is a continuation-in-part of application No. 12/586,339, filed on Sep. 21, 2009.

(51) Int. Cl.
*H01L 21/60* (2006.01)
*H01L 21/78* (2006.01)

(52) U.S. Cl.
USPC .... 438/123; 438/121; 438/124; 257/E21.506; 257/E21.599

(58) Field of Classification Search
USPC .......................................... 438/121, 123, 124
See application file for complete search history.

(56) References Cited

U.S. PATENT DOCUMENTS

| | | | | |
|---|---|---|---|---|
| 6,124,630 | A * | 9/2000 | Stave | 257/666 |
| 6,703,075 | B1 * | 3/2004 | Lin et al. | 427/256 |
| 7,245,005 | B2 * | 7/2007 | Moll et al. | 257/676 |
| 2004/0175863 | A1 * | 9/2004 | Jiang et al. | 438/106 |
| 2005/0238074 | A1 * | 10/2005 | Matsushita et al. | 372/43.01 |
| 2005/0266617 | A1 * | 12/2005 | Ichitsubo et al. | 438/123 |
| 2007/0281392 | A1 * | 12/2007 | Yee et al. | 438/111 |
| 2007/0290336 | A1 * | 12/2007 | Sun et al. | 257/735 |
| 2008/0149730 | A1 * | 6/2008 | Hubmer et al. | 235/492 |
| 2009/0218673 | A1 * | 9/2009 | Sun et al. | 257/690 |
| 2011/0068457 | A1 * | 3/2011 | Zhang et al. | 257/692 |

* cited by examiner

*Primary Examiner* — Alexander Ghyka
(74) *Attorney, Agent, or Firm* — Bo-In Lin

(57) ABSTRACT

This invention discloses a semiconductor package with adhesive material pre-printed on the lead frame and chip, and the manufacturing method. The adhesive material is applied onto the chip carrier and the pin of the lead frame and also on the front electrode of the semiconductor chip via pre-printing. The back of the semiconductor chip is adhered on the chip carrier, and the front electrode of the semiconductor chip and the pin are connected respectively with a metal connector. The size, shape and thickness of the adhesive material are applied according to different application requirements according to size and shapes of the contact zone of the semiconductor chip and the metal connector. Particularly, the adhesive zones are formed by pre-printing the adhesive material thus significantly enhance the quality and performance of semiconductor products, and improves the productivity.

8 Claims, 12 Drawing Sheets

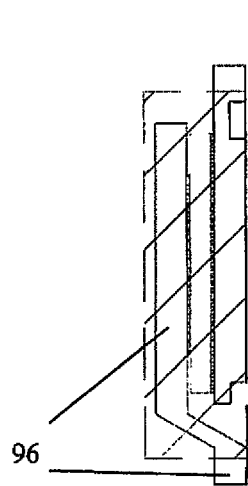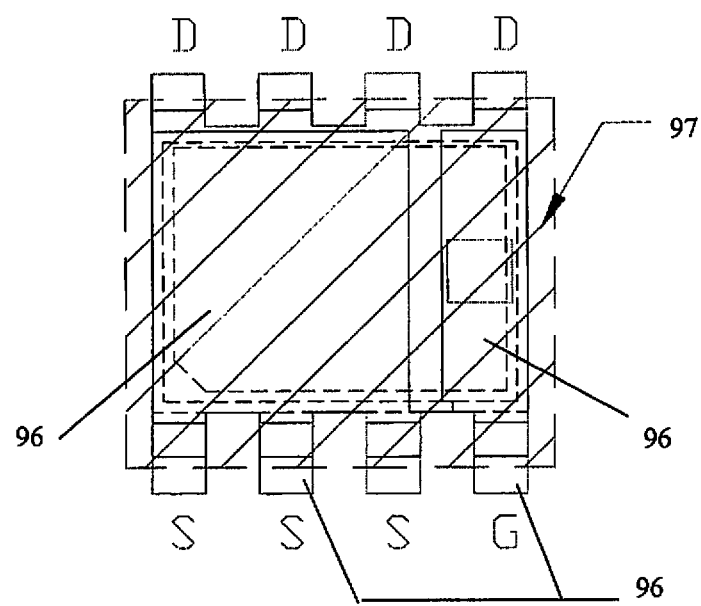
Fig. 9B
Fig. 9A

SEMICONDUCTOR PACKAGE WITH ADHESIVE MATERIAL PRE-PRINTED ON THE LEAD FRAME AND CHIP, AND ITS MANUFACTURING METHOD

This Patent Application is a Continuation Patent Application (CPA) of another application Ser. No. 12/799,811 filed on Apr. 30, 2010 now U.S. Pat. No. 8,222,088 by a common Applicant of this Application. Application Ser. No. 12/799,811 is a Continuation in Part (CIP) Application of another co-pending Application with a Ser. No. 12/586,339 filed by a common Inventor of this Application on Sep. 21, 2009. The disclosures made in application Ser. Nos. 12/799,811 and 12/586,339 are hereby incorporated by reference.

FIELD OF INVENTION

This invention generally relates to the field of semiconductor device package and packaging process. More particularly, the present invention is directed to a semiconductor package configuration and manufacturing method by preprinting the adhesive material on the lead frame and chip to securely attach the chip to the leadframe.

BACKGROUND OF THE INVENTION

In semiconductor device packaging, a lead frame is a substrate supporting the chips, which is made of copper or alloy. The lead frame has the following features: good ductility, high strength, easy formability, excellent coating performance, good corrosion resistance and anti-oxidization performance, high electrical conductivity and thermal conductivity, good adherence to plastic package, and having heat expansion coefficient close to that of the chips and molding material. The lead frame includes a chip carrier for adhering the chip thereon, and a plurality of pins for connecting the chip to the external of the package; wherein, it is necessary to connect the chips with the pins using various connection technologies such as bond wire, metal plate, ribbon or other conductive material.

The lead frames commonly used at present are manufactured by stamping or etching a metal sheet. Generally, the bonding zones on the lead frame (i.e. the chip carrier and pin of the lead frame) are processed by silver plating in spot, ring or other optional patterns in order to enhance the bondage of gold wires or copper wires and prevent oxidization. In addition, depending on the process of interconnection, non-plated lead frames may also be used, wherein the chip is adhered onto the chip carrier with soft solder, and the chip and pins are connected via aluminum wires.

The following is a manufacturing process in the existing semiconductor packaging technology. FIG. 1A is the structural diagram of semiconductor lead frame 1. It includes a chip carrier 11 for adhering the chip, two pins 12 and 13 for connecting the chip to the external of package. As shown in FIG. 1B, the commonly used method for adhering chips is to dispense adhesive material 14 onto the surface of the chip carrier 11 by adhesive injection; wherein, the adhesive material can be epoxy resin, including conductive or non-conductive epoxy resin formed by adhesive injection. As shown in FIG. 1C, the chip (e.g. IC) 15 is then placed on the chip carrier 11 and adhered on it via the adhesive material 14 then cured, thus finishing the chip adherence. As shown in FIG. 1D, the chip 15 is connected respectively to the pin 12 and pin 13 using several metal wires 16. The metal wires 16 are connected with the chip 15 and the pin 12 and pin 13 respectively using wire bonding. As shown in FIG. 1E, the lead frame 1 is plastically molded, and sealed inside the plastic package 17 to finish the packaging procedure. The chip 15 inside the semiconductor package can be connected with the external component via the pins 12 and 13.

The above procedure for connection of the chip and pins can also be as shown in FIG. 1F, wherein the chip 15 is connected with the pins 12 and 13 using several metal connection plates 18. The metal connection plates 18 are respectively connected with the chip 15 and the pins 12 and 13 using adhesive material (e.g. soldering paste or epoxy resin) formed by adhesive injection. Then, as shown in FIG. 1G, the lead frame 1 is plastically molded, and sealed inside the plastic package 17 to finish the procedure. The chip 15 inside the semiconductor package can be connected with the external component via the pins 12 and 13.

The above procedure for connection of the chip and pin can also be as shown in FIG. 1H, wherein the chip 15 is connected with the pin 12 using the metal wire 16, and the chip 15 is connected with the pin 13 using the metal plate 18. The metal wire 16 is connected with the chip 15 and the pin 12 via wire bonding; while the metal connection plate 18 is connected with the chip 15 and the pin 13 respectively using the adhesive material (e.g. soldering paste or epoxy resin) formed by adhesive injection. Then, as shown in FIG. 1I, the lead frame 1 is plastically molded, and sealed inside the plastic package 17 to finish the procedure. The chip 15 inside the semiconductor package can be connected with external components via the pins 12 and 13.

However, the above semiconductor package manufactured by adhering chip and lead frame as well as connecting chip and pins with adhesive material formed by adhesive injection has the following disadvantages:

1. For a package with certain chip carrier size, if adhesive material (soldering paste or epoxy resin) is formed on the chip carrier by adhesive injection, after the chip is adhered on it, the adhesive material will unavoidable overflow around the chip, which takes up certain space therefore limits the chip size to be smaller than the chip carrier size. This is undesirable especially for power semiconductor device as the power handling capability of a power semiconductor device is usually proportional to the chip size.
2. The method of forming adhesive material (soldering paste or epoxy resin) by adhesive injection on the chip carrier for adhering the chip will cause the formed adhesive material to be uneven in thickness, thus resulting in inclination of the chip adhered on it.
3. Existing process of adhering the chip onto the chip carrier using the soldering paste or epoxy resin as the adhesive material tends to produce very high stress likely to cause the chip to crack.
4. It is required to apply hydrogen or nitrogen to cleanup the residual of the soldering paste on the chip after adhering the chip onto the chip carrier using the soldering paste as the adhesive material.
5. During the process of adhering the chip, if soldering paste or eutectic material is used as adhesive material, higher process operating temperature is required, which causes the lead frame to oxidize quickly.
6. After adhesive injection and placing the chip onto the chip carrier, an offline high temperature curing step is required and the production line efficiency is greatly impaired.
7. The epoxy resin has lower electric conductivity and thermal conductivity. The thickness of the epoxy resin formed by adhesive injection is hard to control and tends to be thicker than necessary leading to higher resistance in both current and heat conduction.

In view of the above, it is very necessary to introduce a new semiconductor package and method, improve the existing chip adherence technology to overcome the disadvantages, thus enhancing product quality and productivity.

SUMMARY OF INVENTION

One aspect of this invention is to provide a semiconductor package with adhesive material pre-printed on the lead frame and chip and its manufacturing method, to overcome the deficiencies of existing technologies by improving chip adherence technology, thus enhancing the product quality and productivity.

This invention discloses a semiconductor package with adhesive material pre-printed on lead frame, whereas:

The lead frame may have a chip carriers and a plurality of pins;

The semiconductor chip may have a plurality of front electrodes and back electrodes; the back electrodes of the semiconductor chip may be adhered on the chip carrier, while the front electrodes may be connected with the pins via metal connectors;

Wherein, the chip carrier includes pre-printed adhesive material in a plurality of zones.

Furthermore, the semiconductor chip may be a power MOSFET (metal oxide semiconductor field-effect transistor) or an IC (integrated circuit) chip.

The adhesive material is a printable epoxy resin, which may be conductive or non-conductive.

In one implementation method of this invention, the adhesive materials pre-printed on the chip carrier having substantially the same size and shape as the chip. In another implementation method of this invention, the adhesive materials pre-printed on the chip carrier covers substantially the entire chip carrier. In another implementation method of this invention, the adhesive material pre-printed on the chip carrier is larger in size than the chip. In another implementation method of this invention, the adhesive material pre-printed on the chip carrier is smaller in size than the chip.

Furthermore, the semiconductor package in this invention also includes a plastic package for sealing the lead frame and semiconductor chip inside.

According to the above, this invention also discloses a manufacturing method for the semiconductor package with adhesive material pre-printed on the lead frame, comprising the following steps:

1. Print adhesive material on the lead frame;
1.1. Print adhesive material in a plurality zones on the surface of the chip carrier of the lead frame at room temperature;
2. Adhere the chip onto the chip carrier of the lead frame via the printed adhesive material at high temperature;
3. Carry out plastic packaging of the lead frame and semiconductor chip, sealing them inside the plastic package, thus finishing the manufacturing of this semiconductor package.

In step 1.1, the lead frame is printed utilizing stencil or screen technology, which printing a plurality of lead frame units forming a lead frame strip at one time, specifically including:

1.1.1 Make a number of openings on the stencil or screen;
Wherein, the number of the openings is the same as that of the zones on the chip carrier of the lead frame strip that need to be printed with adhesive material;
Each of the openings may be of the same size and shape as each zone on the chip carrier of the lead frame to be printed with adhesive material;

1.1.2. Form adhesive material in each of the openings via printing;
Wherein, the adhesive material, i.e. the opening, is of the same thickness as the stencil or screen.

In one implementation method of this invention, in step 1.1 the adhesive material printed on the chip carrier having substantially the same size and shape as the chip. In another implementation method of this invention, in step 1.1 the adhesive material printed on the chip carrier covers substantially the entire chip carrier. In another implementation method of this invention, in step 1.1 the adhesive material printed on the chip carrier is larger in size than the chip. In another implementation method of this invention, in step 1.1 the adhesive material printed on the chip carrier is smaller in size than the chip.

In step 1.1 the method further comprising a step to configure the chip carrier into a plurality of separated zones each includes a printed adhesive material zone corresponding to a configuration of backside electrodes on the chip to be adhered thereto, whereas each separated zone on the chip carrier is electrically insulated from each other.

Furthermore, the step 1 also includes the step 1.2. carry out high-temperature B-stage curing of the adhesive material printed on the surface of the chip carrier; wherein, the B-stage curing temperature is: 110° C.~140° C. In step 2, the operating temperature for adhering the semiconductor chip onto the chip carrier is: 95° C.~130° C.

The semiconductor chip may be a power MOSFET chip or IC chip and the printable epoxy may be conductive or none conductive. The semiconductor chip may comprising a plurality of front electrodes and the step may further include a step to electrically connect the front electrodes of the chip to the pins of the lead frame, thus forming the connection of the chip and the pins.

This invention discloses a semiconductor package with adhesive material pre-printed on the lead frame and chip, whereas:

The lead frame may have a chip carriers and a plurality of pins;

The semiconductor chip may have a plurality back electrodes; the back electrodes of the semiconductor chip may be adhered on the chip carriers. The semiconductor chip may further include a plurality of front electrodes connected with the pins via metal connectors;

Wherein, plurality zones of pre-printed adhesive material may be printed respectively on the chip carrier, the pins and the front electrodes of the semiconductor chip.

Furthermore, the semiconductor chip may be a power MOSFET chip or IC chip. The adhesive material may conductive or none conductive printable epoxy resin.

In one implementation method of this invention, the adhesive materials pre-printed on the chip carrier are substantially the same size and shape as the chip. In another implementation method of this invention, the adhesive materials pre-printed on the chip carrier substantially cover the entire chip carrier. In another implementation method of this invention, the adhesive material pre-printed on the chip carrier is larger in size than the chip. In another implementation method of this invention, the adhesive material pre-printed on the chip carrier is smaller in size than the chip.

In one implementation method of this invention, the adhesive material pre-printed on the pins and the pin is substantially of the same size and shape. In another implementation method of this invention, the adhesive material pre-printed on the pin is smaller in size than the pin; furthermore, the adhesive material pre-printed on the pin is substantially of the same size and shape as the contact zone of the metal connector and the pin; or the adhesive material pre-printed on the pin is larger in size than the contact zone of the metal connector and the pin.

In one implementation method of this invention, a zone of pre-printed adhesive material is included on a front electrode, which can be substantially of the same size and shape as the front electrode; or smaller in size than the front electrode, in which case, the single adhesive material pre-printed on the front electrode is of substantially the same size and shape as the contact zone of the metal connector and the front electrode, or larger in size than the contact zone of the metal connector and the front electrode. In another implementation method of this invention, several zones of pre-printed adhesive material are included on the front electrode, and the adhesive material of each zone is of substantially the same size and shape as the contact zone of the metal connector and the front electrode, or larger in size than the contact zone of the metal connector and the front electrode.

Furthermore, the semiconductor package in this invention also includes a plastic package for sealing the lead frame and semiconductor chip inside.

According to the above, this invention also discloses a manufacturing method for the semiconductor package with adhesive material pre-printed on the lead frame and chip, which includes the following steps:
1. Print adhesive material on the lead frame;
1.1. Print a first adhesive material in a plurality of zones on the surface of the chip carrier and pins of the lead frame at room temperature;
2. Print adhesive material on the wafer, forming the semiconductor chip;
2.1. Print a second adhesive material in a plurality of zones on the surface of the front electrode of the wafer at room temperature;
3. Adhere the chip onto the chip carrier of the lead frame with backside of semiconductor chip in contact with the printed adhesive material at high temperature;
4. Adhere the two ends of the metal connector respectively to the front electrodes of the chip and the pins of the lead frame via adhesive material at high temperature, thus forming the connection of the chip and the pins;
5. Carry out plastic packaging of the lead frame and semiconductor chip, sealing them inside the plastic package, thus finishing the manufacturing of this semiconductor package.

In this invention, the adhesive material is printable epoxy resin.

In step 1.1, the lead frame is printed utilizing stencil or screen technology, which finishes the printing of one lead frame at one time, specifically including:
1.1.1 Make a plurality of openings on the stencil or screen;
Wherein, the quantity of the openings is the same as that of the zones on the chip carrier and pin of the lead frames to be printed with adhesive material;
Each of the openings is of substantially the same size and shape as each zone on the chip carrier and pin of the lead frame to be printed with adhesive material;
1.2. Form adhesive material in each of the openings via printing;
Wherein, the adhesive material, i.e. the opening, is of the same thickness as the stencil or screen.
In one implementation method of this invention, in step 1.1 the adhesive material printed on the chip carrier having substantially the same size and shape as the chip. In another implementation method of this invention, in step 1.1 the adhesive material printed on the chip carrier covers substantially the entire chip carrier. In another implementation method of this invention, in step 1.1 the adhesive material printed on the chip carrier is larger in size than the chip. In another implementation method of this invention, in step 1.1 the adhesive material printed on the chip carrier is smaller in size than the chip.

In one implementation method of this invention, in step 1.1 the adhesive material printed on the pin and the pin are of the same size and shape. In another implementation method of this invention, in step 1.1 the adhesive material pre-printed on the pin is smaller in size than the pin; furthermore, the adhesive material printed on the pins is of the same size and shape as the contact zone of the metal connector and the pin; or the adhesive material printed on the pins is larger in size than the contact zone of the metal connector and the pin. Furthermore, the step 1 also includes a step 1.2. to carry out high-temperature B-stage curing of the adhesive material printed on the surfaces of the chip carrier and pin; wherein, the curing temperature is: 110° C.~140° C.

In step 2.1, the wafer is printed utilizing stencil or screen technology, which finishes the printing of one wafer at one time, specifically including:
2.1.1 Make a plurality of openings on the stencil or screen;
Wherein, the number of the openings is the same as that of the zones on the front electrode of the wafer to be printed with adhesive material;
Each of the openings is of the same size and shape as each zone on the front electrode of the wafer to be printed with adhesive material;
2.1.2. Form adhesive material in each of the openings via printing;
Wherein, the adhesive material, i.e. the opening, is of the same thickness as the stencil or screen.
In one implementation method of this invention, in step 2.1 a zone of adhesive material is printed on each front electrode, and the adhesive material and front electrode are of the same size and shape; or smaller in size than the front electrode, in which case, the single adhesive material printed on the front electrode is of the same size and shape as the contact zone of the metal connector and the front electrode, or larger in size than the contact zone of the metal connector and the front electrode. In another implementation method of this invention, in step 2.1 several zones of adhesive material are printed on each front electrode, and the adhesive material of each zone is of the same size and shape as the contact zone of the metal connector and the front electrode, or larger in size than the contact zone of the metal connector and the front electrode.

Furthermore, the step 2 also includes the step 2.2. carry out high-temperature curing of the adhesive material printed on the surface of the front electrode of the wafer; wherein, the curing temperature is: 110° C.~140° C.

The step 2 also includes the step 2.3. demarcate and cut the wafer, forming several individual semiconductor chips.

In step 2, the semiconductor chip is a power MOSFET chip or IC chip.

In step 3, the operating temperature for adhering the semiconductor chip onto the chip carrier is: 95° C.~130° C.

In step 4, the operating temperature for adhering the metal connectors respectively onto the front electrodes of the chip and the pins of the lead frame is: 150° C.~170° C.

In step 4, the metal connector is metal connection plate or metal connection ribbon.

the step 4 further comprising a step of inline curing after adhering the metal connector respectively onto the front electrode of the semiconductor chip and the pin of the lead frame.

In the semiconductor package disclosed by this invention, a layer of adhesive material is pre-printed on the front electrode of the semiconductor chip as well as the chip carrier and pins of the lead frame. The size and shape of the adhesive material is decided by referring to the contact zones of the semiconductor chip and metal connectors, while its thickness is decided according to the required electric performance of the chip surface; there is no need to adhering the chip and the metal connectors by the traditional adhesive injection, so the semiconductor package involved in this invention has the following advantages:

1. In a same package and chip carrier size, since adhesive material (printable epoxy resin) is pre-printed on the chip carrier, when the chip is adhered, the adhesive material will not overflow around the chip, thus realizing packaging with maximum chip area (i.e. the chip is of the same size as the chip carrier).
2. The adhesive material formed by pre-printing has even thickness, thus effectively reducing the inclination of the adhered chip, and improving the rate of finished products.
3. Since printable epoxy resin is used, compared to adhesive material like soldering paste or general epoxy resin used in existing technology, after the chip is adhered onto the chip carrier, less stress is produced, thus reducing chip crack; and the printable epoxy resin has high electric conductivity and thermal conductivity, so the packaged semiconductor components have better electric performance and thermal performance.
4. Since printable epoxy resin is used as the adhesive material, there is no need to clean the chip with hydrogen or nitrogen afterwards.
5. Since printable epoxy resin is used as the adhesive material, compared to the existing technology, the process operating temperature required during the chip adhering is comparatively lower, thus slowing down the oxidization process of the lead frame.
6. After pre-printing the adhesive material on the lead frame, the adhesive material can be directly cured online, ensuring continuous and rapid production and effectively improving the productivity.
7. Since printable epoxy resin is used as the adhesive material, the air is unlikely to enter the epoxy resin material in the manufacturing process, so there is little or zero clearance inside the material.

In summary, the semiconductor package and its manufacturing method disclosed by this invention can effectively improve the quality and performance of semiconductor products, and improve the productivity.

BRIEF DESCRIPTION OF THE DRAWINGS

FIG. 9A is a top view and FIG. 9B is a cross sectional view of a semiconductor package with adhesive material pre-printed on the lead frame and the front electrodes of MOSFET in the fifth example of implementation of this invention;

DESCRIPTION OF THE PREFERRED EMBODIMENTS

A detailed explanation of this invention is described below by reference to of FIGS. 2 to 10, with selected embodiments as examples to illustrate the semiconductor packages according to the methods and configurations disclosed in this invention.

The semiconductor package and its manufacturing method disclosed by this invention apply to variety of semiconductor chips, including power MOSFET and IC chips, etc. In the following implementation examples, the power MOSFET chip is used to explain the packaging method; in addition, the printable epoxy resin (so called to distinguish from the general epoxy resin used in the background technology) is used as the adhesive material formed by printing, to facilitate better understanding of the various advantages and beneficial effects of the packaging method of this invention. But it should be noted that these details and examples are not used to limit the scope of this invention.

Implementation Example 1

Figure 1A:
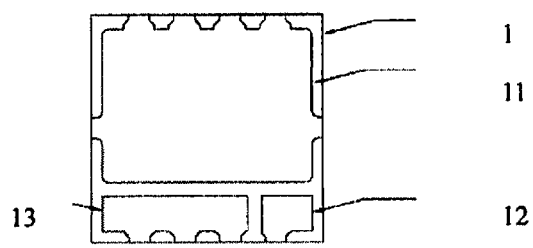
FIGS. 1A to 1I shows the procedure of semiconductor package manufacturing by adhesive injection in existing technology.
Figure 1B:
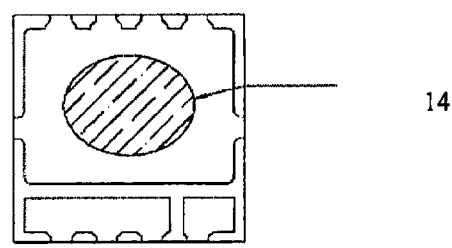
Figure 1C:
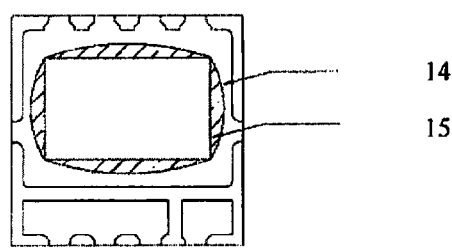
Figure 1D:
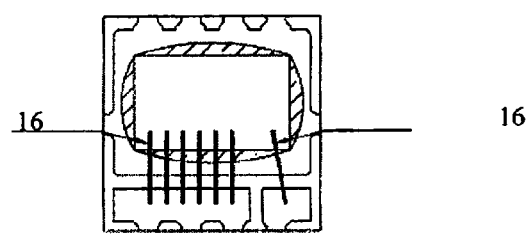
Figure 1E:
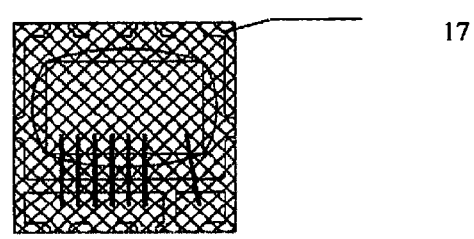
Figure 1F:
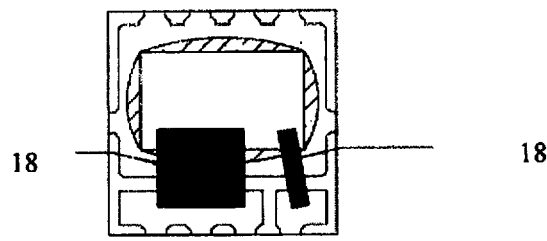
Figure 1G:
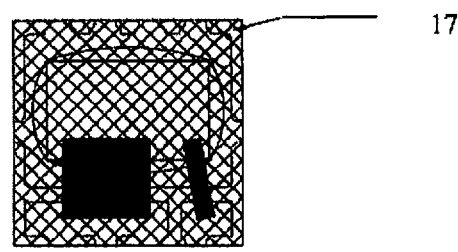
Figure 1H:
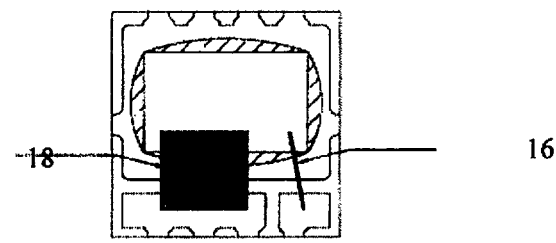
Figure 1I:
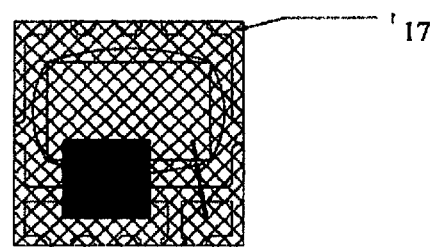
Figure 2A:
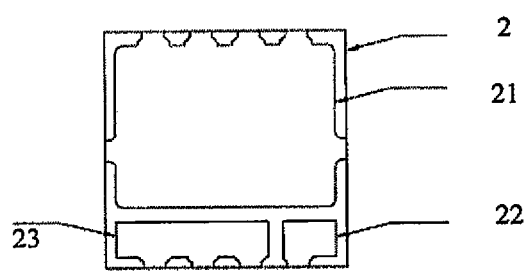
FIG. 2A to 2E shows the series diagram of the manufacturing method of semiconductor package with adhesive material pre-printed on the lead frame in one example of implementation of this invention.
Figure 2B:
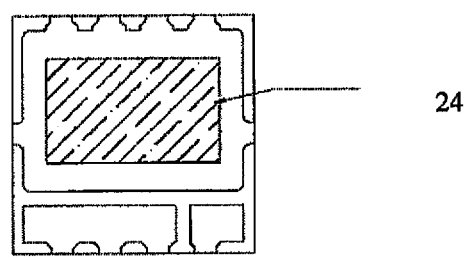
Figure 2C:
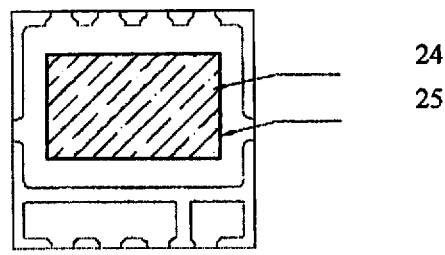
Figure 2D:
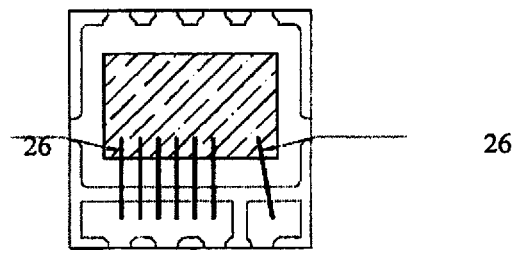
Figure 2E:
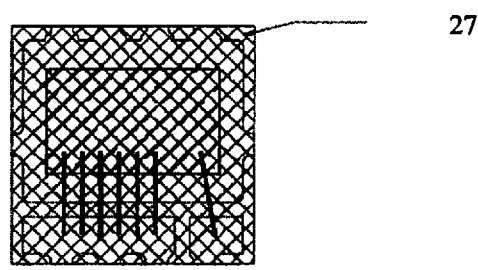

FIG. 2E shows the structural diagram of a semiconductor package with adhesive material pre-printed on the lead frame in this implementation example, which includes: the lead frame 2 with the chip carrier 21 and two pins 22 and 23 (as shown in FIG. 2A); and MOSFET 25, which has a top gate and a top source set on its upper surface (not shown in the figure) and a bottom drain set on its back (not shown in the figure). The bottom drain of the MOSFET 25 is adhered on the chip carrier 21, and its top gate and top source are bonded with the pins 22 and 23 via several metal wires 26. A single zone of printable epoxy resin 24 formed by pre-printing is included on the chip carrier 21 (as shown in FIG. 2B), and the printable epoxy resin 24 and the MOSFET 25 are of substantially the same size and shape. In this application the epoxy resin 24 is a conductive printable epoxy resin that can be pre-cured into B-stage, such as Ablecoat® 8008HT or Ablecoat® 8008MD readily available from Henkel Corporation of Irvin, Calif. Non-conductive epoxy may be used for some other applications. As shown in FIG. 2C, MOSFET 25 is completely overlaid on the printable epoxy resin 24. The maxima chip size in this package is the same size as the chip carrier of the lead frame. In case the chip has more than one electrode on it backside, the chip carrier may be configured into a plurality of separated zones each includes a printed adhesive material zone corresponding to the configuration of backside electrodes on the chip. Each separated zone on the chip carrier may be electrically insulated from each other.

According to the above, as shown in FIG. 2A to 2E, the details of the manufacturing method of the semiconductor package in this implementation example are given below. Referring to FIG. 2A, the lead frame 2 in this implementation example includes the chip carrier 21 and two pins 22 and 23. As shown in FIG. 2B, a single zone of printable epoxy resin 24 is pre-printed on the chip carrier 21 of the lead frame 2 at room temperature. In this implementation example, the lead frame is printed utilizing the stencil or screen technology, which finishes the printing of one entire strip of lead frames at one time. The strip of lead frames includes several units of the lead frames 2 in this implementation example but only one unit is shown in the figure. The specific procedure is as follows: firstly, make an opening on the stencil or screen in a location corresponding to the chip carrier of each unit of lead frame, i.e. when the entire strip of lead frames includes N units of lead frames, make N openings on the stencil and screen. The N openings are respectively corresponding to the chip carriers of N units of lead frames, and are of substantially the same size and shape as the epoxy zones to be printed on the chip carrier 21 afterwards. Then, apply epoxy resin 24 in the N openings. The thickness of the printable epoxy resin 24 is about the thickness of the opening, i.e. the thickness of the stencil or screen, which determines the electric performance and bonding strength of the semiconductor component to be finished finally; the thinner this printable epoxy resin 24 is, the smaller the resistance of the semiconductor component is, and the better the electric performance will be. However, when this printable epoxy resin 24 becomes too thin, it is likely to crack due to insufficient bonding strength, so generally speaking, the thickness of this printable epoxy resin 24 is around 25 μm or slightly less than 25 μm, which provide the semiconductor component with better electric performance and enough bonding strength (approx. 2 to 3 kg). Finally, the formed printable epoxy resin 24 may undergo a high-temperature curing into B-stage directly for about one hour. The curing temperature is 110° C. to 140° C., preferably 120° C. This step can be arranged as a lead frame preparation step without impacting the productivity of the chip package assembly line.

The package assembly line may start with strip of lead frames with printed adhesive 24 cured in B-stage. As shown in FIG. 2C, MOSFET 25 is adhered onto the chip carrier 21 of the lead frame 2 via the printable epoxy resin 24 with the bottom drain contacting the printable epoxy resin 24 at a high temperature of 95° C. to 130° C. (preferably 120° C.), which takes about 200 ms to 300 ms, and the required pressure is dependent on the dimensions of MOSFET 25, generally 85 g/mm2 per unit area. It is further clear from FIG. 2C that the printable epoxy resin 24 and the MOSFET 25 are of substantially the same size and shape, and MOSFET 25 is substantially overlaid on the printable epoxy resin 24. The lead frame and chip assembly of FIG. 2C may then be cured either inline at 280 degree C. for about 10 seconds or offline at 175 degree C. for about 60 minutes. Inline curing is preferred as assembly line throughput is greatly improved. As there is no epoxy overflow in this chip attachment process, the chip size can be as big as the chip carrier size, which improves the power handling capability of the device. In next step as shown in FIG. 2D, several metal wires 6 are connected respectively with the front electrode and pin 22 and 23 of MOSFET 25 by wire bonding, thus forming connections of MOSFET 25 and the pins 22 and 23. As shown in FIG. 2E, the lead frame 2 and MOSFET 25 are plastically sealed inside the plastic package 27 after applying molding material, and cut from the entire strip of lead frames to finish the individual semiconductor packaging of MOSFET 25. Pins 22 and 23 may be exposed from the sides of the package, and the chip carrier 21 may be exposed from the bottom of the package, thus able to connect the power MOSFET 25 to other external components.

Implementation Example 2

Figure 3A:
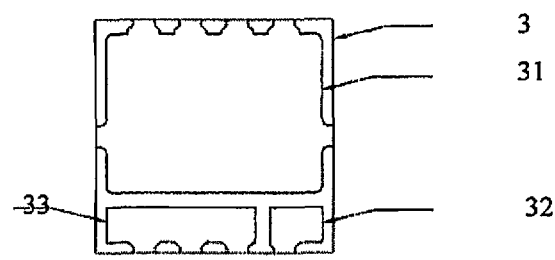
FIG. 3A to 3E shows the series diagram of the manufacturing method of semiconductor package with adhesive material pre-printed on the lead frame in another example of implementation of this invention.
Figure 3B:
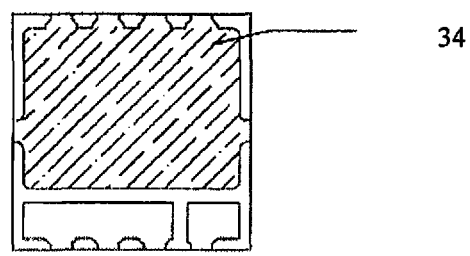
Figure 3C:
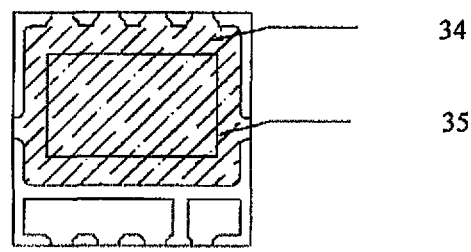
Figure 3D:
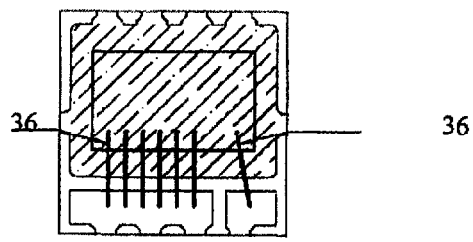
Figure 3E:
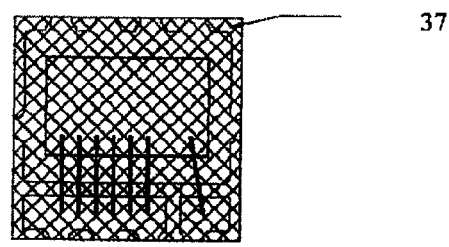

FIG. 3A to 3E show another implementation example of semiconductor package with adhesive material pre-printed on the lead frame in this invention. It is similar to the implementation example shown in FIG. 2A to 2E, and the only difference is that, the printable epoxy resin 34 formed in this implementation example is substantially of the same size and shape as the chip carrier 31 on the lead frame 3 (as shown in FIG. 3B). Even though it is clear from FIG. 3C that when MOSFET 35 is adhered on the printable epoxy resin 34, there is still some exposed portion of the chip carrier 31 printed with the epoxy resin 34, as there is no epoxy overflow in this chip attachment process, the chip size can be as big as the chip carrier size, which improve the power handling capability of the device. The lead frame and chip assembly of FIG. 3C may then be cured either inline at 280 degree C. for about 10 seconds or offline at 175 degree C. for about 60 minutes. Inline curing is preferred as assembly line throughput is greatly improved. In next step as shown in FIG. 3D, several metal wires 36 are connected respectively with the front electrode and pin 32 and 33 of MOSFET 35 by wire bonding, thus forming connections of MOSFET 35 and the pins 32 and 33. As shown in FIG. 3E, the lead frame 3 and MOSFET 35 are plastically sealed inside the plastic package 37, and cut from the entire strip of lead frames to finish the individual semiconductor packaging of MOSFET 35. Pins 32 and 33 may be exposed from the sides of the package, and the chip carrier 31 may be exposed from the bottom of the package, thus able to connect the power MOSFET 35 to other external components. The maxima chip size in this package is the size of the chip carrier.

Implementation Example 3

Figure 4A:
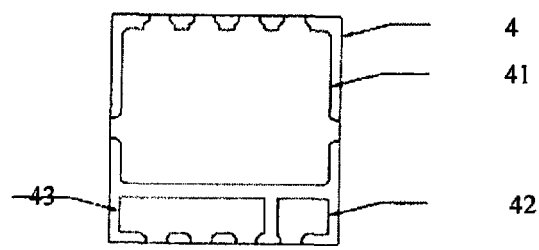
FIG. 4A to 4E shows the series diagram of the manufacturing method of semiconductor package with adhesive material pre-printed on the lead frame in another example of implementation of this invention.
Figure 4B:
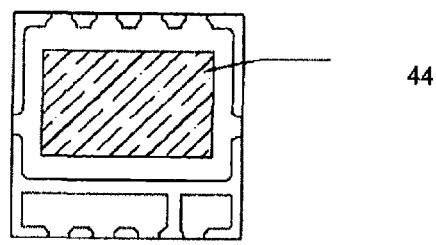
Figure 4C:
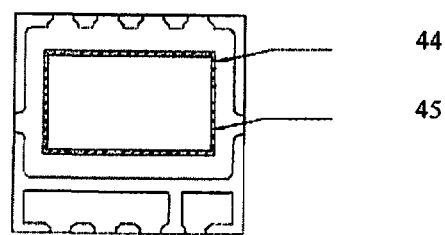
Figure 4D:
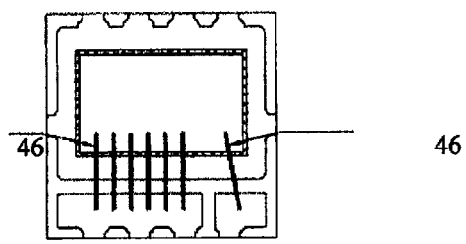
Figure 4E:
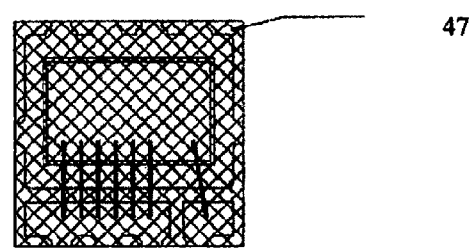

FIG. 4A to 4E show another implementation example of semiconductor package with adhesive material pre-printed on the lead frame in this invention. It is similar to the implementation examples shown in FIG. 2A to 2E and FIG. 3A to 3E, and the only difference is that, the printable epoxy resin 44 formed in this implementation example is substantially of the same shape as MOSFET 45, but larger in size. It is clear from FIGS. 4B and 4C that when MOSFET 45 is adhered on the printable epoxy resin 44, there is still a small exposed portion printed with the printable epoxy resin 44. Then, the process is the same as that in implementation example 1 and implementation example 2. As shown in FIG. 4D, several metal wires 46 are connected respectively with the front electrode and pin 42 and 43 of MOSFET 45 by wire bonding, thus forming bondage of MOSFET 45 and the pins 42 and 43. As shown in FIG. 4E, the lead frame 4 and MOSFET 45 are plastically sealed inside the plastic package 47, and cut from the entire strip of lead frames to finish the individual semiconductor packaging of the power MOSFET 45. Pins 42 and 43 may be exposed from the sides of the package, and the chip carrier 41 may be exposed from the bottom of the package, thus able to connect the MOSFET 45 to other external components.

Similarly, this invention also includes a modified implementation example, and the only difference is that the formed printable epoxy resin 44 is of substantially the same shape as MOSFET 45, but smaller in size. It suffices that the dimensions of the printable epoxy resin 44 can ensure enough adherence zone to securely adhere the MOSFET 45 onto the chip carrier 41 without falling off. In case the chip has more than one electrode on it backside, the chip carrier may be configured into a plurality of separated zones each includes a printed adhesive material zone corresponding to the configuration of backside electrodes on the chip. Each separated zone on the chip carrier may be electrically insulated from each other.

Implementation Example 4

This implementation example discloses a semiconductor package with adhesive material pre-printed on the lead frame and chip. The bottom drain of the MOSFET is adhered on the chip carrier, and the top gate and top source are connected with the pins respectively using several metal connection plates or metal ribbons.

Figure 5A:
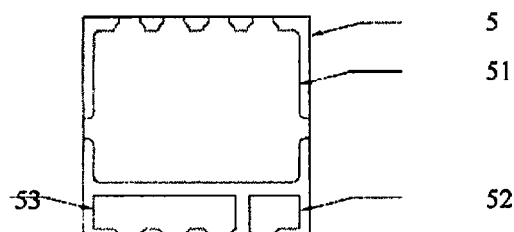
FIG. 5A to 5C shows the structural diagram of the adhesive material pre-printed on the chip carries and pins of the lead frame in this invention.
Figure 5B:
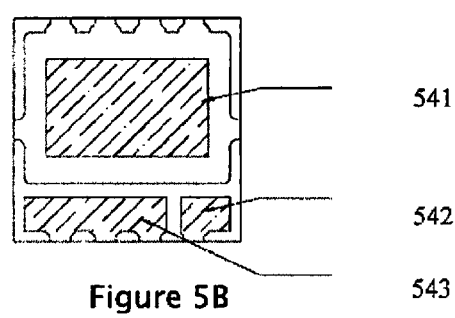
Figure 5C:
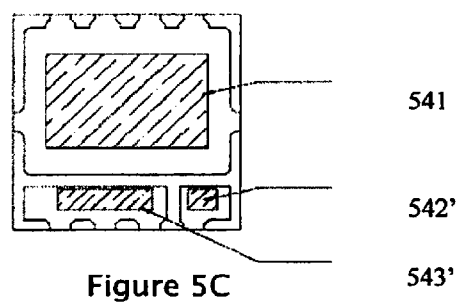

As shown in FIG. 5A, this semiconductor package includes: a lead frame 5 with a chip carrier 51 and two pins 52 and 53; wherein, a single zone of printable epoxy resin 541 formed by pre-printing is included on the chip carrier 51 (as shown in FIG. 5B). In this implementation example, this printable epoxy resin 541 is of substantially the same size and shape as the MOSFET 55 to be adhered on it afterwards. Of course, this printable epoxy resin 541 can be of the same size and shape as the chip carrier 51, as described in the preceding implementation examples; or this printable epoxy resin 541 can also be of the same shape as and larger size than the MOSFET 55; or it can be of the same shape as and smaller size than the MOSFET 55. As shown in FIG. 5B, a single zone of printable epoxy resin 542 and 543 formed by pre-printing is included on each of the two pins 52 and 53 of the lead frame 5. In this implementation example, the printable epoxy resin 542 is of substantially the same shape as and smaller size than the pin 52, while the printable epoxy resin 543 is of substantially the same shape as and smaller size than the pin 53. Of course, the printable epoxy resin 542' can be of substantially the same size and shape as the pin 52, and the printable epoxy resin 543' can be substantially of the same size and shape as the pin 53, as shown in FIG. 5C.

Figure 6A:
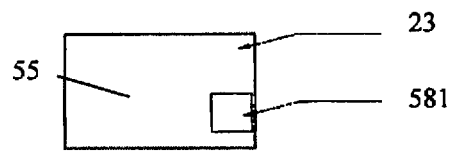
FIG. 6A to 6E shows the structural diagram of adhesive material pre-printed on the front electrode of the power MOSFET chip.
Figure 6B:
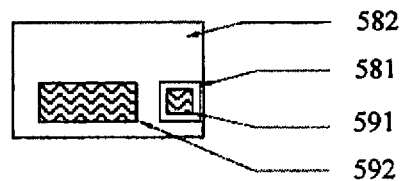
Figure 6C:
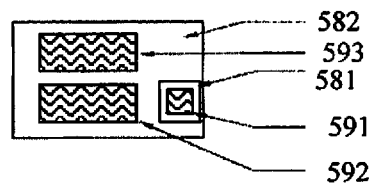
Figure 6D:
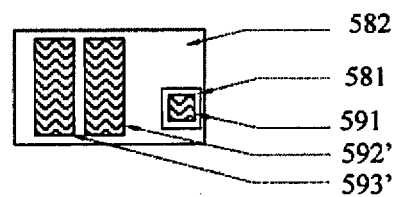
Figure 6E:
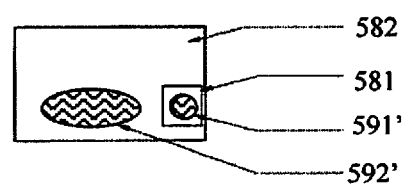

As shown in FIG. 6A, the semiconductor also includes the MOSFET 55, which has the top gate 581 and top source 582 set on its upper surface and the bottom drain set on its back (not shown in the figure). As shown in FIG. 6B, in this implementation example, a single zone of printable epoxy resin 591 and 592 formed by pre-printing is included on each of the top gate 581 and top source 582. The printable epoxy resin 591 is smaller in size than the top gate 581, while the printable epoxy resin 592 is also smaller in size than the top source 582. Of course, in another implementation example of this invention, the printable epoxy resin 591 and 592 can also be of substantially the same size and shape as the top gate 581 and top source 582. Or, in another implementation example of this invention, a single zone of printable epoxy resin 591 formed by pre-printing is included on the top gate 581 of the MOSFET 55 shown in FIG. 6C, and this printable epoxy resin 591 is smaller in size than the top gate 581; while two or more zones of horizontally set printable epoxy resin 592 and 593 formed by pre-printing are included on the top source 582. Or, in another implementation example of this invention, a single zone of printable epoxy resin 591 formed by pre-printing is included on the top gate 581 of the MOSFET 55 shown in FIG. 6D, and this printable epoxy resin 591 is smaller in size than the top gate 581; while two or more zones of vertically set printable epoxy resin 592' and 593' formed by pre-printing are included on the top source 582. Or, in another implementation example of this invention, a single zone of round printable epoxy resin 591' formed by pre-printing is included on the top gate 581 of the MOSFET 55 shown in FIG. 6E, and this printable epoxy resin 591' is smaller in size than the top gate 581; while a zone of oval printable epoxy resin 592' formed by pre-printing is included on the top source 582, and this printable epoxy resin 592' is smaller in size than the top source 582. In the above implementation examples, the front electrodes are printed utilizing the stencil or screen technology, which finishes the printing of one entire wafer at one time. Even though only one unit is shown in the figures, the wafer includes a plurality of units of the MOSFET 55 in this implementation example. The specific procedure is as follows: firstly, make openings on the stencil or screen corresponding to each of the top gate 581 and top source 582 of each MOSFET 55 according to the number of the zones and their shapes and sizes of epoxy intended to be printed thereon. Then, form printable epoxy resin in each opening. The thickness of the printable epoxy resin 591 and 592 is substantially the thickness of the corresponding opening, i.e. the thickness of the stencil or screen, which determines the contact resistance and bonding strength of the surface of MOSFET 55. The formed printable epoxy resin in multiple zones may undergo a high-temperature curing into B-stage for about one hour. The curing temperature is 110° C.~140° C., preferably 120° C. Finally, demarcate and cut the wafer into individual MOSFETs 55. The wafer level process of epoxy printing, B-stage curing and wafer dicing may be arranged as a chip preparation step without impacting chip assembly line.

Figure 7A:
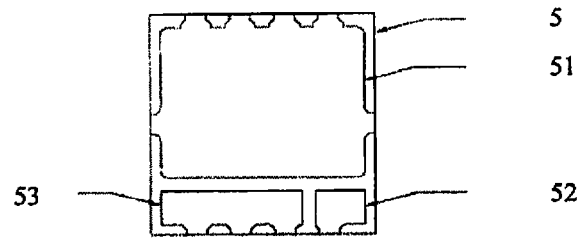
FIG. 7A to 7E shows the series diagram of the manufacturing method of semiconductor package with adhesive material pre-printed on the lead frame and the front electrodes of MOSFET in the fourth example of implementation of this invention.
Figure 7B:
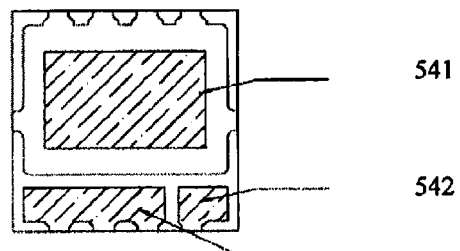

According to the above, as shown in FIG. 7A to 7E and FIG. 8, the details of the manufacturing method of the semiconductor package in this implementation example are given below. Referring to FIG. 7A, the lead frame 5 in this implementation example includes a chip carrier 51 and two pins 52 and 53. As shown in FIG. 7B, a single zone of the printable epoxy resin 541 is pre-printed on the surface of the chip carrier 51 of the lead frame 5, and a single zone of the printable epoxy resin 542 and 543 is pre-printed on the two pins 52 and 53 of the lead frame 5, at room temperature. In this implementation example, the lead frame is printed utilizing stencil or screen technology, which finishes the printing of one entire strip of lead frames at one time. Even though only one unit is shown in the figures, the strip of lead frames includes several units of the lead frames 5 in this implementation example. The specific procedure is as follows: firstly, make three openings located on the stencil or screen corresponding to the chip carrier and pins of each unit of lead frame, and the openings are of substantially the same size and shape of the adhesive intended to be printed. Then, form the printable epoxy resin in each opening. The thickness of the printable epoxy resin 541, 542 and 543 is substantially the thickness of the corresponding opening, i.e. the thickness of the stencil or screen, which determines the electric performance and bonding strength of the semiconductor component to be finished finally; the thinner the three printable epoxy resin is, the smaller the resistance of the semiconductor component is, and the better the electric performance will be. However, when the printable epoxy resin become too thin, it is likely to crack due to insufficient bonding strength, so generally speaking, the thickness of the printable epoxy resin is around 25 µm or slightly less than 25 µm, which can provide the semiconductor component better electric performance and enough bonding strength (approx. 2 to 3 kg). Finally, the formed printable epoxy resin in three zones can undergo a high-temperature curing into B-stage for about one hour. The curing temperature is 110° C. to 140° C., preferably 120° C. The lead frame with printed epoxy in strip form may be cured into B-stage arranged as a lead frame preparation step without impacting chip assembly line.

Figure 7C:
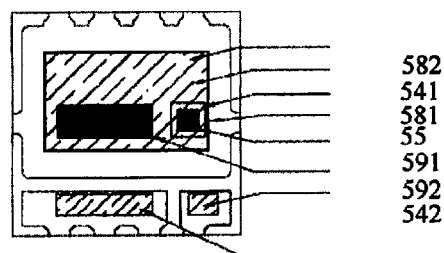

The chip package assembly line may start with individual chips with pre-printed epoxy and lead frame strip with pre-printed epoxy. As shown in FIG. 7C, the printable epoxy resin 591 and 592 are formed by pre-printing on the top gate 581 and top source 582 of the MOSFET 55. MOSFET 55 is adhered onto the chip carrier 51 of the lead frame 5 via the printable epoxy resin 541 with the bottom drain contacting the printable epoxy resin 541 at a high temperature of 95° C. to 130° C. (preferably 120° C.), which takes about 200 ms to 300 ms, and the required pressure is dependent on the dimensions of MOSFET 55, generally 85 g/mm2 per unit area. It is further shown from FIG. 2C that the printable epoxy resin 541 and the MOSFET 55 are of substantially the same size and shape, and MOSFET 55 is substantially overlaid on the printable epoxy resin 541. As there is no epoxy overflow in this chip attachment process, the chip size can be as big as the chip carrier size, which improves the power handling capability of the device.

Figure 7D:
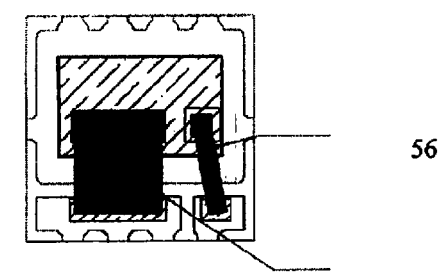

In next step as shown in FIG. 7D, the two ends of the two metal connection plates 56 are respectively adhered onto MOSFET and pins via the printable epoxy resin at the high temperature of 150° C. to 170° C. (preferably 160° C.) to form connection, and the required pressure is dependent on the dimensions of the metal connection plates 56, generally 100 g/mm2 per unit area; wherein the two ends of one metal connection plate 56 are respectively adhered onto the top gate 581 and the pin 52, while the two ends of another metal connection plate 56 are respectively adhered onto the top source 582 and the pin 53, the printable epoxy resin 542 and 543 pre-printed on the pins 52 and 53 may be of substantially the same sizes as or larger than the contact zones of the metal connection plates 56 and the pins 52 and 53; while the printable epoxy resin 591 and 592 pre-printed on the top gate 581 and the top source 582 may be of substantially the same size as or larger than the contact zones of the metal connection plates 56 and the top gate 581 and the top source 582. The assembly is then going through an inline curing process at 280 degree C. for about 10 seconds. This greatly improves the production line output efficiency due to short curing time that can be carried out in line. Alternatively offline curing can be carried out at 175° C. for about 60 minutes.

Figure 7E:
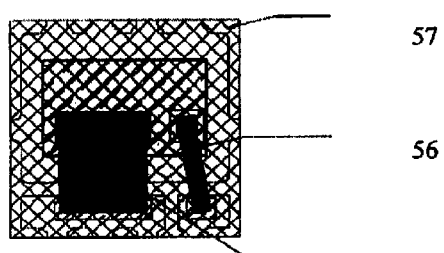
Figure 8:
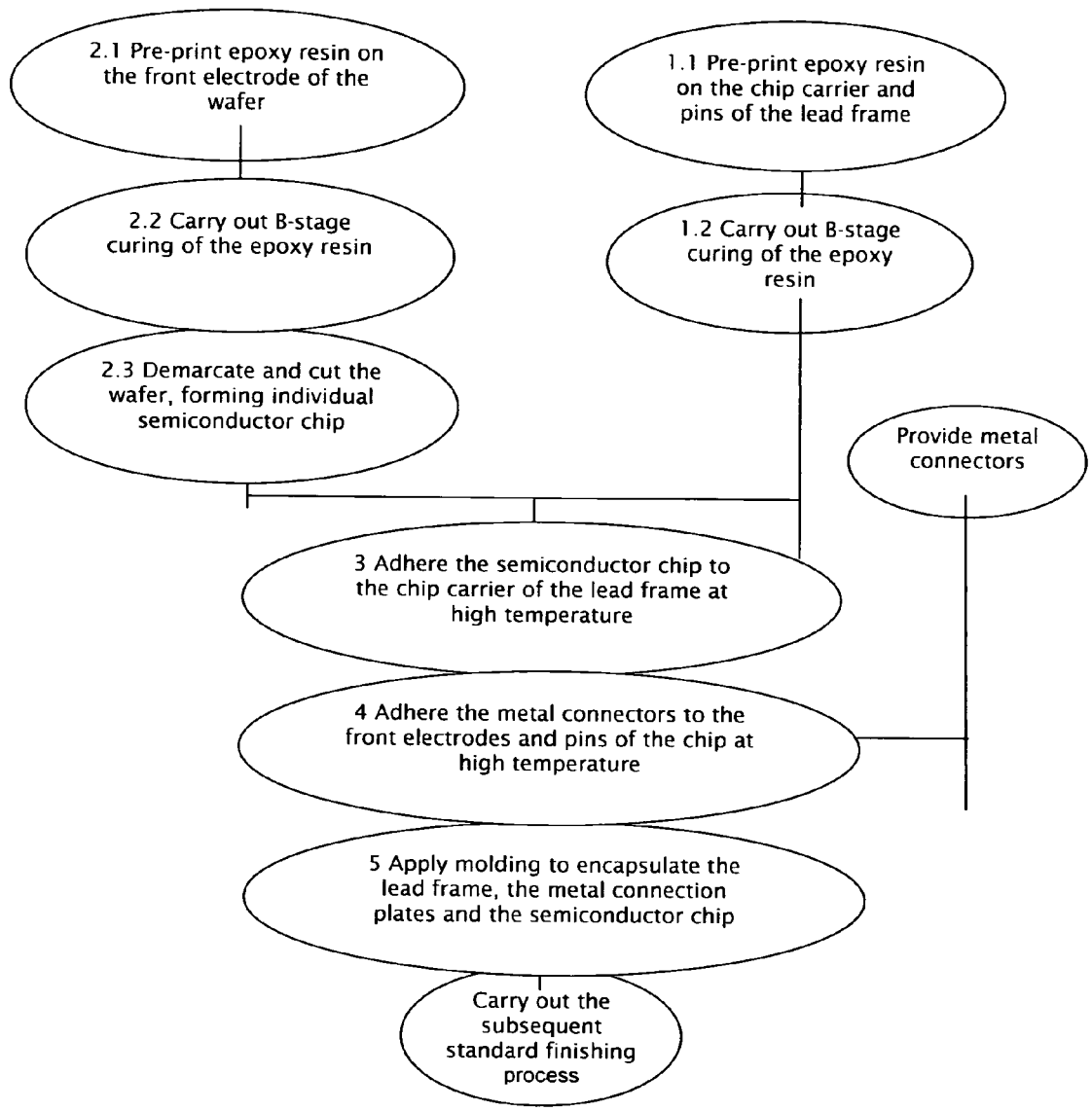
FIG. 8 shows the flowchart of the manufacturing method of semiconductor package with adhesive material pre-printed on the lead frame and the front electrodes of MOSFET in the fourth example of implementation of this invention.

The cured assembly of multiple unit strip of lead frame 5 and MOSFET 55 are plastically sealed inside a plastic package 57 by applying molding material, and individual packaged device is cut from the entire strip of lead frames to finish the semiconductor packaging of MOSFET 55. As shown in FIG. 7E, pins 52 and 53 may be exposed from the sides of the package, and the chip carrier 51 may be exposed from the bottom of the package, thus able to connect the power MOSFET 55 to other external components.

In case the chip has more than one electrode on, it backside, the chip carrier may be configured into a plurality of separated zones each includes a printed adhesive material zone corresponding to the configuration of backside electrodes on the chip. Each separated zone on the chip carrier may be electrically insulated from each other.

Implementation Example 5

Figure 10:
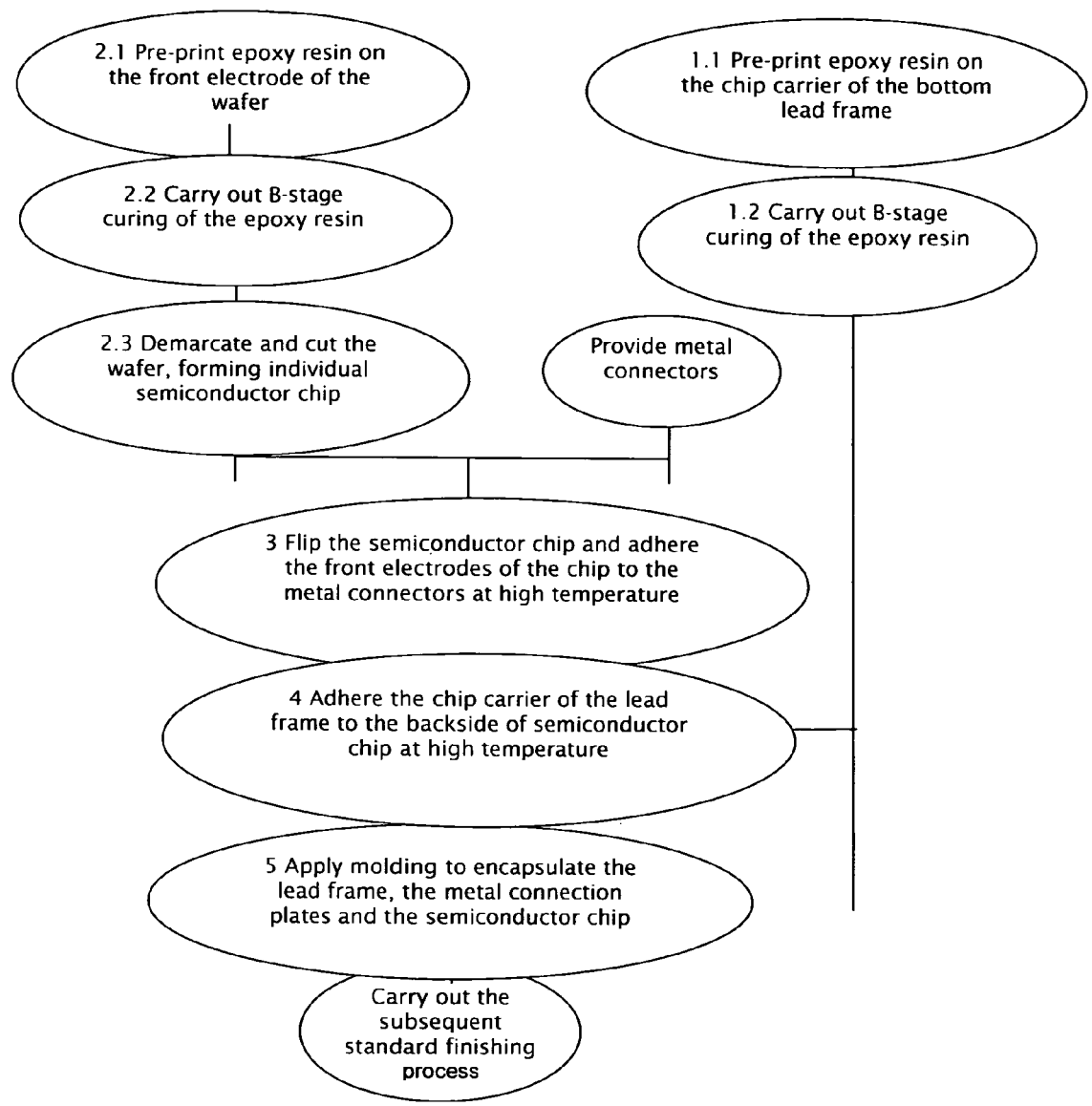
FIG. 10 shows the flowchart of the manufacturing method of semiconductor package with adhesive material pre-printed on the lead frame and the front electrodes of MOSFET in the fifth example of implementation of this invention.

The package structure as shown in FIGS. 9A and 9B respectively a top view and a cross sectional view of this implementation example is similar to that of Implementation Example 4 except that while one ends of the metal connection plates connecting to the top gate and source electrodes of the MOSFET respectively, the other ends of the metal connection plates 96 extend outside of the molding encapsulation 97 functioning as the package pins without connecting to the pins of a bottom lead frame. The assembly process is also similar except those performed in step 3 and step 4. As shown in FIG. 10, after the wafer is printed and B-stage pre-cured with a first printable epoxy resin and finally cut into individual chips as prepared in the embodiment of Implementation Example 4, the semiconductor chip is flip and attached to the metal connection plates 96 with the first pre-printed epoxy resin on the top gate and source electrode regions respectively adhere to portions of the gate and source metal connection plates and cured at an elevated temperature of 95° C. to 130° C. (preferably 120° C.) for about 200 ms to 300 ms under a pressure of about 85 g/mm2 per unit area. The portions of the metal connection plates connected to the pre-printed epoxy resin are preferably near a first ends of the metal connection plates with a second ends of the metal connection plates properly extending over a first edge of the MOSFET chip. Alternatively the portions of the metal connection plates connected to the pre-printed epoxy resin may be located in a middle region of the metal connection plates with both ends of the metal connection plates properly extending over two opposite edges of the MOSFET chip. In the mean time a bottom lead frame may be prepared in a separate procedure as described in the previous embodiments of this invention to form a second pre-printed epoxy resin on the chip carrier of the bottom lead frame. As shown in step 4 of FIG. 10 the lead frame is then adhered to the drain electrode located on the bottom of MOSFET chip at an elevated temperature of 95° C. to 130° C. (preferably 120° C.) for about 200 ms to 300 ms under a pressure of about 85 g/mm2 per unit area, with the drain pins of lead frame properly extend over a second edge of the chip. The second edge of the MOSFET chip is preferably different from the first edge and preferably opposite to the first edge. The assembly is then cured at about 175° C. for about an hour. An advantage of this process is that the metal connection plates can be provided as a top lead frame connected in an array to improve the assembly line throughput. Each top lead frame unit in the array comprises a number of metal connection plates corresponding to the number of front electrodes of the semiconductor chip. After a plurality of chips flip-chip attached to the array of top lead frame, the bottom lead frame is provided as an array of the bottom lead frame to stack on top of the semiconductor chips bottom, therefore greatly improving the assembling efficiency.

In the semiconductor package disclosed by this invention, a layer of adhesive material is pre-printed on the front electrode of the semiconductor chip as well as the chip carrier and pin of the lead frame. The size and shape of the adhesive material is decided by referring to the contact zones of the semiconductor chip and metal connectors, while its thickness is decided according to the required electric performance of the chip surface; there is no need to adhering the chip and the metal connectors by the traditional adhesive injection, thus overcoming the disadvantages and insufficiencies in the existing technology, effectively enhancing the quality and performance of semiconductor products, and improving the productivity.

Although the detailed contents of this invention have been introduced through the above selected implementation examples, it should be noted that the above description shall not be deemed as limitation on this invention. After technical personnel in this field have read the above contents, multiple modifications and substitutions to this invention will be self-evident. Therefore, the protection scope of this invention shall be limited by the attached claims.

We claim:

1. A method for manufacturing a semiconductor package comprising:
   pre-printing a first adhesive material onto a plurality of front electrodes and a back electrode of a semiconductor chip disposed on a wafer at room temperature followed by pre-curing the adhesive material at a first temperature then dicing the wafer into a plurality of semiconductor chips;
   pre-printing a second adhesive material on a plurality of adhesive zones including a chip carrier and pins on a lead frame at room temperature followed by curing the adhesive material at a second high temperature;
   applying a third high temperature for adhering the back electrode of the semiconductor chip to the chip carrier of the lead frame;
   providing metal connector plates and applying a fourth high temperature for adhering the metal connector plates to the front electrodes and the pins on the leadframe; and
   applying a molding material to encapsulate the semiconductor chip and at least portions of the lead frame and the metal connections plates.

2. The method for manufacturing a semiconductor package of claim 1 wherein:
   the steps of applying the first high temperature and the third high temperature comprise steps of applying the first and third high temperatures substantially within a range of 110° C. to 140° C. for curing the first and second adhesive materials into B stages respectively.

3. The method for manufacturing a semiconductor package of claim 1 wherein:
   the step of pre-printing a first adhesive material onto a plurality of front electrodes and the back electrode of a semiconductor chip on a wafer level further comprising a step of:
   providing a stencil or screen having a number of openings corresponding to a number of zones on the front electrodes to be printed with the first adhesive material on the wafer;
   printing the first adhesive material onto the front electrodes through the stencil or screen, whereas, the first adhesive material printed having a thickness substantially the same as a thickness of the stencil or screen.

4. The method for manufacturing a semiconductor package of claim 1 wherein:
   the steps of applying the second and fourth high temperatures comprise steps of applying the second temperatures substantially in a range of 95° C. to 130° C.

5. The method for manufacturing a semiconductor package of claim 1 wherein:
   the step of applying the fourth high temperatures further comprises a step of applying the fifth temperature at substantially 175° C.

6. The method for manufacturing a semiconductor package of claim 1 wherein:
   the step of forming the plurality of metal connection plates is a step of forming a top lead frame as the plurality of metal connection plates.

7. The method for manufacturing a semiconductor package of claim 1 wherein:
   the step of forming the plurality of metal connection plates is a step of forming an array of top lead frames as the plurality of metal connection plates.

8. The method for manufacturing a semiconductor package of claim 1 wherein:
   the step of forming the plurality of metal connection plates is a step of forming an end of each of the plurality of metal connection plates extending outside the molding material functioning as pins of the package.

* * * * *